United States Patent
Coquand et al.

(10) Patent No.: US 10,256,102 B2
(45) Date of Patent: Apr. 9, 2019

(54) METHOD FOR FABRICATING A FIELD EFFECT TRANSISTOR HAVING A SURROUNDING GRID

(71) Applicant: Commissariat a l'energie atomique et aux energies alternatives, Paris (FR)

(72) Inventors: Remi Coquand, Les Marches (FR); Emmanuel Augendre, Montbonnot (FR); Shay Reboh, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/938,321

(22) Filed: Mar. 28, 2018

(65) Prior Publication Data

US 2018/0301341 A1    Oct. 18, 2018

(30) Foreign Application Priority Data

Mar. 31, 2017  (FR) ...................................... 17 52741

(51) Int. Cl.
    *H01L 21/285*   (2006.01)
    *H01L 29/66*    (2006.01)
    (Continued)

(52) U.S. Cl.
    CPC .. *H01L 21/28518* (2013.01); *H01L 21/02532* (2013.01); *H01L 21/02603* (2013.01);
    (Continued)

(58) Field of Classification Search
    None
    See application file for complete search history.

(56) References Cited

U.S. PATENT DOCUMENTS

| 6,982,460 B1 | 1/2006 | Cohen et al. |
| 2005/0127412 A1 | 6/2005 | Cohen et al. |

(Continued)

OTHER PUBLICATIONS

French Preliminary Search Report dated Nov. 21, 2017 in French Application 17 52741 filed on Mar. 31, 2017 (with English Translation of Categories of Cited Documents and Written Opinion).

(Continued)

*Primary Examiner* — Asok K Sarkar
(74) *Attorney, Agent, or Firm* — Oblon, McClelland, Maier & Neustadt, L.L.P.

(57) ABSTRACT

A process for fabricating a gate-wrap-around field-effect transistor is provided, including providing a substrate surmounted with first and second nanowires extending in a same longitudinal direction and having a median portion covered by a first material, and first and second ends that are arranged on either side of the median portion, a periphery of which is covered by respective first and second dielectric spacers made of a second material that is different from the first material, the ends having exposed lateral faces; doping a portion of the first and second ends via the lateral faces; depositing an amorphous silicon alloy on the first and second lateral faces followed by crystallizing the alloy; and depositing a metal on either side of the nanowires to form first and second metal contacts that respectively make electrical contact with the doped portions of the first and second ends of the nanowires.

13 Claims, 5 Drawing Sheets

(51) Int. Cl.
  *H01L 29/40* (2006.01)
  *H01L 29/417* (2006.01)
  *H01L 29/423* (2006.01)
  *H01L 29/775* (2006.01)
  *H01L 29/06* (2006.01)
  *H01L 29/08* (2006.01)
  *H01L 21/02* (2006.01)
  *H01L 29/45* (2006.01)
  *H01L 29/786* (2006.01)

(52) U.S. Cl.
  CPC ...... *H01L 29/0673* (2013.01); *H01L 29/0847* (2013.01); *H01L 29/401* (2013.01); *H01L 29/41725* (2013.01); *H01L 29/42392* (2013.01); *H01L 29/458* (2013.01); *H01L 29/66439* (2013.01); *H01L 29/66742* (2013.01); *H01L 29/775* (2013.01); *H01L 29/78651* (2013.01); *H01L 29/78696* (2013.01)

(56) References Cited

U.S. PATENT DOCUMENTS

| | | |
|---|---|---|
| 2011/0062417 A1 | 3/2011 | Iwayama et al. |
| 2011/0133165 A1 | 6/2011 | Bangsaruntip et al. |
| 2012/0018784 A1 | 1/2012 | Kittl |
| 2014/0014904 A1 | 1/2014 | Cohen et al. |
| 2014/0017890 A1 | 1/2014 | Cohen et al. |
| 2014/0151639 A1 | 6/2014 | Chang et al. |
| 2015/0333162 A1* | 11/2015 | Bouche ............ H01L 21/76897 257/24 |
| 2015/0372115 A1 | 12/2015 | Koh et al. |
| 2016/0049397 A1* | 2/2016 | Chang ............ H01L 27/092 257/329 |
| 2017/0069481 A1 | 3/2017 | Doris et al. |
| 2017/0069734 A1 | 3/2017 | Doris et al. |
| 2017/0069763 A1 | 3/2017 | Doris et al. |
| 2017/0194510 A1 | 7/2017 | Doris et al. |
| 2018/0219064 A1* | 8/2018 | Cheng ............ H01L 29/0649 |

OTHER PUBLICATIONS

Yi-Chia Chou, et al., "Nucleation and growth of epitaxial silicide in silicon nanowires," Materials Science and Engineering, 2010, pp. 112-125.

L. Gaben, et al., "Evaluation of Stacked Nanowires Transistors for CMOS: Performance and Technology Opportunities," 12 Pages.

J. Borrel, et al., "Considerations for Efficient Contact Resistivity Reduction via Fermi Level Depinning-Impact of MIS Contacts on 10nm Node nMOSFET DC Characteristics," Symposium on VLSI Technology Digest of Technical Papers, 2015, pp. T116-T117.

S. Barraud, et al., "Vertically Stacked-NanoWires MOSFETs in a Replacement Metal Gate Process with Inner Spacer and SiGe Source/Drain," 4 Pages.

L. Knoll, et al., "Ultrathin Ni Silicides With Low Contact Resistance on Strained and Unstrained Silicon," IEEE Electron Device Letters, vol. 31, No. 4, Apr. 2010, pp. 350-352.

Isaac Lauer, et al., "Si Nanowire CMOS Fabricated with Minimal Deviation from RMG FinFET Technology Showing Record Performance," Symposium on VLSI Technology Digest of Technical Papers, 2015, pp. T140-T141.

* cited by examiner

METHOD FOR FABRICATING A FIELD EFFECT TRANSISTOR HAVING A SURROUNDING GRID

The invention relates to gate-wrap-around field-effect transistors, and in particular to processes for fabricating such transistors.

The increase in the performance levels of integrated circuits due to the miniaturization of field-effect transistors is confronted with a technological and scientific roadblock. One of the underlying problems is the increase in static and dynamic power in integrated circuits. In order to decrease this consumed power, new architectures and new materials that will allow a low operating voltage to be obtained are being intensively studied at the present time.

In particular, for technological nodes under 50 nm, electrostatic control of the channel by the gate becomes a predominant operating parameter for the operation of the transistor. To improve this electrostatic control, various multiple-gate transistor technologies are being developed, in particular gate-wrap-around transistors.

The following is a known process for fabricating a gate-wrap-around transistor. A stack of nanowires comprising in alternation silicon nanowires and silicon-germanium nanowires on a substrate is formed, so as to for example obtain compressively strained SiGe nanowires and relaxed silicon nanowires. A sacrificial gate is formed to cover the median portion of the stack of nanowires. Insulating spacers are also formed on either side of the sacrificial gate, in order to cover an intermediate median portion of the stack of nanowires. The channels of the transistor are intended to be formed in this median portion. Those portions of the nanowires of the stack which protrude beyond the spacers are not covered and are removed by etching. A portion of the SiGe nanowires that is located under the insulating spacers is removed by selective etching, so as to form cavities under these spacers. Dielectric is deposited inside the cavities to form internal spacers, which are intended to insulate the source and the drain with respect to the gate of the transistor.

In a step of growing silicon-germanium by epitaxy, a source and a drain are formed on either side of the stack. The source and the drain formed by epitaxy then make contact and are in continuity with the silicon nanowires that were preserved under the sacrificial gate and the spacers. The source and drain are then encapsulated in an encapsulating or passivating material. A groove is then formed level with the sacrificial gate and the sacrificial gate is removed. The residual stack of nanowires is then uncovered. By selective etching, the silicon-germanium nanowires are removed. A gate insulator is then deposited on the uncovered portion of the silicon nanowires, then a gate material is formed on the gate insulator in order to encapsulate the median portion of these nanowires.

The passivating/encapsulating material is subsequently removed from the source and from the drain. The upper face of the source and of the drain is subsequently silicided. Source and drain contacts are subsequently formed, in particular by depositing metal on the silicided face of the source and of the drain.

The gate-wrap-around transistor obtained according to this process has drawbacks. Specifically, for small technological nodes, the dimensions of the source and of the drain that are formed by epitaxy are highly reduced, which may result in the formation of voids in the source or the drain and/or in very high contact resistance. Furthermore, the greater the number of nanowires in the stack, the greater the observable difference in access resistance between the metal contact and the various channels.

The invention aims to overcome one or more of these drawbacks. The invention aims in particular to homogenize the access resistances to the various channels of a gate-wrap-around transistor. Thus, the invention pertains to a process for fabricating a gate-wrap-around field-effect transistor, as defined in the appended claims.

The invention also pertains to a gate-wrap-around field-effect transistor, as defined in the appended claims.

Other features and advantages of the invention will become clearly apparent from the description that is given thereof below, by way of completely non-limiting indication, with reference to the appended drawings, in which:

FIGS. 1 to 22 illustrate a transistor 1 in various steps of its fabricating process, according to one example of a first embodiment of the invention. The steps described with reference to FIGS. 1 to 5 are known per se by those skilled in the art and given by way of nonlimiting example of how to obtain a superposition of nanowires with a sacrificial gate.

In the present description, the term "nanowire" corresponds to an element the shape of which is elongated in a longitudinal direction, regardless of the shape of the profile of its cross section. The maximum width of the nanowire may be comprised between 50 and 100 nm. The minimum width of the nanowire may be comprised between 10 and 100 nm. The height of the nanowire may for example be comprised between 5 and 12 nm. The longitudinal dimension of the nanowire may be comprised between 10 and 150 nm. In this sense, the term "nanowire" equally encompasses a nanoplate or a nanobar.

Figure 1:
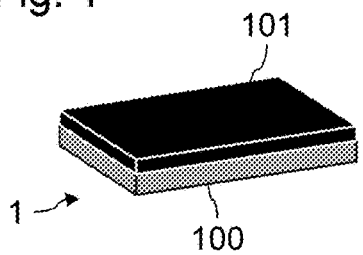
FIGS. 1 to 22 illustrate a transistor during various steps of its fabricating process, according to one example of a first embodiment of the invention.

FIG. 1 shows a substrate, illustrated in perspective. The substrate may for example be an sSOI substrate (sSOI standing for strained silicon-on-insulator) or an SRB substrate (SRB standing for strain relaxed buffer), in a way known per se. It would also be possible to envisage an application to an SOI or bulk substrate. The substrate is here a semiconductor-on-insulator substrate. The substrate here comprises an insulating layer 100 covered with a semiconductor layer 101. The semiconductor layer 101 is here a relaxed SiGe layer. For an SRB substrate, the insulating layer 100 will for example be replaced with a relaxed SiGe layer covered with a silicon layer typically strained with a biaxial tensile strain.

Figure 2:
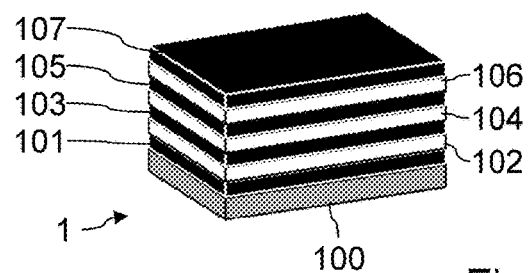

In FIG. 2, a superposition of layers 102 to 107 has been formed on the SiGe layer 101. Thus an alternation of SiGe layers 101, 103, 105 and 107, and silicon layers 102, 104 and 106 has been formed. The layers 102 to 107 are typically formed in sequential steps of epitaxial deposition.

The thickness of the layers 101, 103, 105 and 107 is for example comprised between 5 and 15 nm and is preferably at most 10 nm. This thickness is for example 7 nm. The thickness of the layers 102, 104 and 106 is for example comprised between 5 and 15 nm and is preferably at most 10 nm. This thickness is for example 9 nm.

Figure 3:
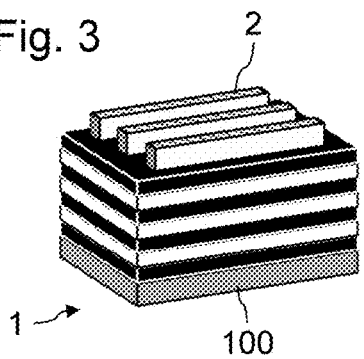
Figure 4:
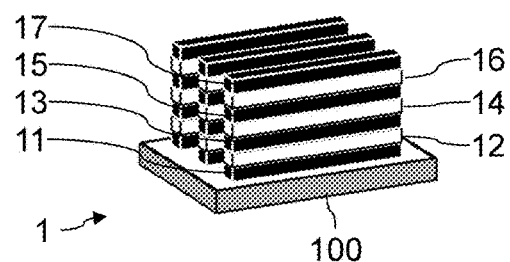

In FIG. 3, a mask 2 has been formed on the superposition of the layers 101 to 107, for example by photolithography. In FIG. 4, the layers 101 to 107 have been etched so as to form superpositions or stacks of adjacent nanowires. Each superposition or stack of nanowires includes a superposition of nanowires 11 to 17. The nanowires 11 to 17 extend in a longitudinal direction, and thus have a length at least two times larger than their width or their thickness. The nanowires 11, 13, 15 and 17 are here made of SiGe, for example.

$Si_{(1-x)}Ge_x$ where $0.2<x<0.6$. The value $x=0.3$ may for example be taken. The nanowires 12, 14 and 16 are here made of silicon. The mask 2 has been removed from the stacks. The width of each stack is for example comprised between 10 and 50 nanometres. The stacks of nanowires here include 7 superposed nanowires. A different number of superposed nanowires may of course be used. The height of the stacks of nanowires is for example comprised between 30 and 100 nanometres.

Figure 5:
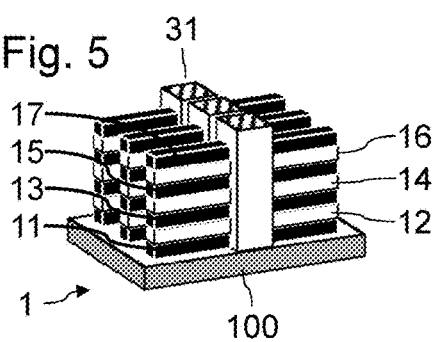

In FIG. 5, a sacrificial gate 31 has been formed for each of the stacks of nanowires. Each sacrificial gate 31 is wrapped around the median portion of a respective stack of nanowires. The sacrificial gate 31 for example comprises a protective layer of a thickness comprised between 1 nm and 3 nm of $SiO_2$ making contact with the nanowires, this layer being covered by a layer of poly-Si. The sacrificial gate 31 may also be formed (nonlimitingly) by a single layer of $SiO_2$. The process for forming and shaping each sacrificial gate 31 is known per se. The gate length of a transistor to be formed is defined by the length over which a sacrificial gate 31 is wrapped around a respective stack of nanowires.

Figure 6:
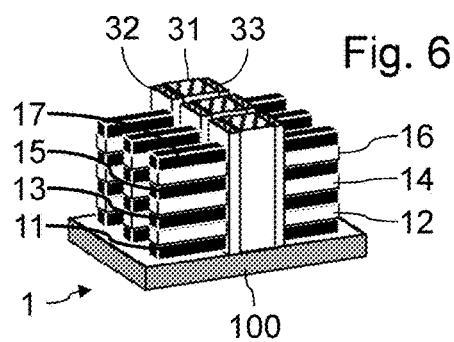

The steps of forming internal spacers, detailed with reference to FIGS. 6 to 9, are known per se by those skilled in the art. In FIG. 6, lateral spacers 32 and 33 have been formed on either side of each of the sacrificial gates 31. The spacers 32 are each wrapped around an intermediate section of the stack of nanowires on one respective side of its median portion and of the sacrificial gate 31. The spacers 33 are each wrapped around an intermediate section of the stack of nanowires on the other side of its median portion and of the sacrificial gate 31. The process for forming and shaping each spacer 32, 33 is known per se. The width of each of the spacers 32 or 33 is for example comprised between 3 and 15 nm. The spacers 32, 33 are for example made of dielectric material. The spacers 32 or 33 are for example made of SiN, SiOCH or of SiBCN. The ends of the stacks of nanowires remain protruding with respect to the spacers 32 or 33 and remain exposed.

Figure 7:
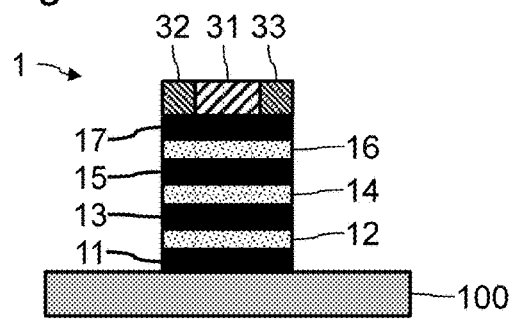

In FIG. 7, the ends of the nanowires 11 to 17 are removed. The median portion of the nanowires 11 to 17 is retained under the sacrificial gate 31 and the intermediate sections of the nanowires 11 to 17 are retained under the lateral spacers 32 and 33. The protruding ends of the nanowires 11 to 17 are for example etched by an anisotropic etch by using the sacrificial gate 31 and the lateral spacers 32 and 33 as an etching mask. The intermediate sections of the nanowires 11 to 17 then form the longitudinal ends of the nanowires 11 to 17.

Figure 8:
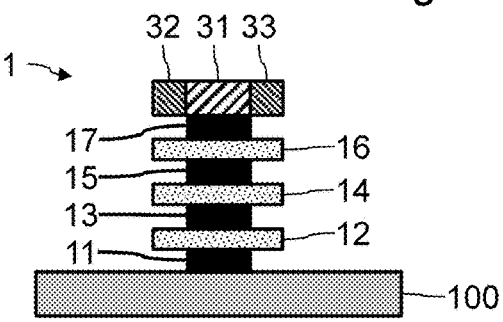

In FIG. 8, cavities are formed by removing the longitudinal ends of the SiGe nanowires 11, 13, 15 and 17, which are initially present under the lateral spacers 32 and 33. A removal operation of this type is for example achieved by means of a selective etch. The longitudinal ends of the nanowires 12, 14 and 16 that are located under the lateral spacers 32 and 33 are retained. The SiGe may be selectively etched with respect to the silicon using HCl chemistry, or using an aqueous mixture of ammonia/peroxide at 70° C.

Figure 9:
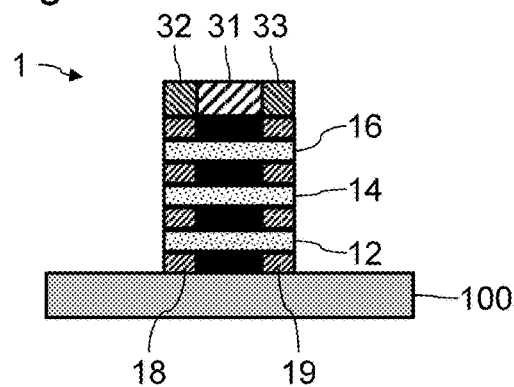

In FIG. 9, internal spacers 18 and 19 are formed in the cavities. To achieve this, a dielectric may be deposited conformally in the cavities subsequent to an etching operation. The internal spacers 18 and 19 are wrapped around the longitudinal ends of the nanowires 12, 14, and 16. The lateral faces of the nanowires 12, 14 and 16 are exposed. The spacers 18 and 19 are advantageously made of a low-dielectric-constant dielectric. The spacers 18 and 19 are for example made of SiBCN or SiOCH. The internal spacers 18 and 19 are typically made from a material that etches very selectively with respect to the other materials used to form the transistor (for example polysilicon and TiN for the gate, $SiO_2$ for a passivating/encapsulating material, etc.). The internal spacers 18 and 19 are for example formed by ALD (atomic layer deposition).

Figure 10:
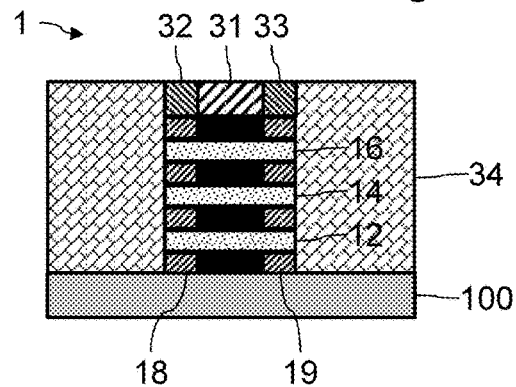

In FIG. 10, an encapsulation material 34 (for example an oxide) has been deposited so as to cover the lateral faces of the nanowires 12, 14 and 16 and of the internal spacers 18 and 19. The encapsulation material 34 may be deposited in a wafer-scale deposition operation, then chemically-mechanically polished until the sacrificial gate 34 and the lateral spacers 32 and 33 are exposed. The use of a $CeO_2$-based paste exhibits for example sufficient selectivity.

Figure 11:
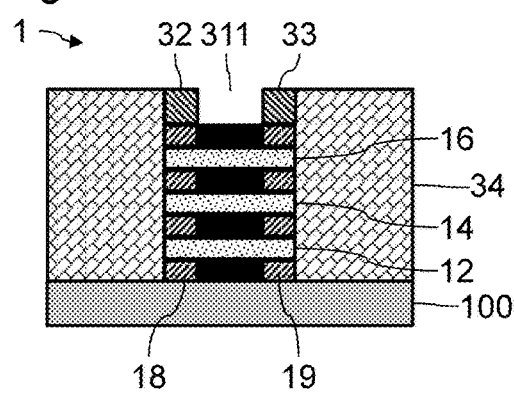

In FIG. 11, the sacrificial gate 31 has been removed in order to produce a groove 311 and thus an access to the median portions of the nanowires 11 to 17. The removal of the sacrificial gate 31 has for example been achieved using an etch that is selective with respect to the material of the lateral spacers 32 and 33. The polysilicon-based sacrificial gate 31 is for example removed using ammonia- ($NH_4OH$), or TMAH- or TEAH-based chemistry.

Figure 12:
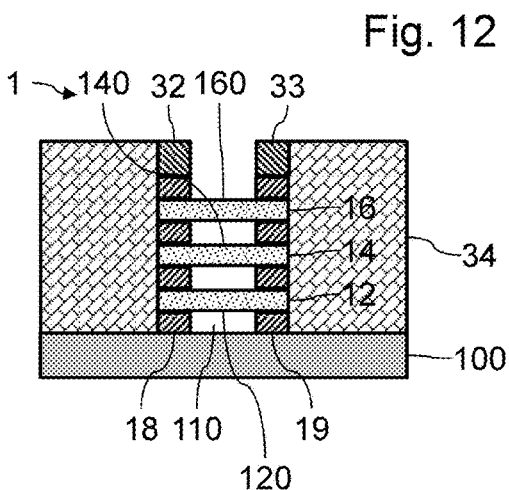

In FIG. 12, the median portion of the nanowires 11, 13, 15 and 17 has been removed selectively while preserving the median portion of the nanowires 12, 14 and 16. The step of selectively removing the median portion of the nanowires 11, 13, 15 and 17 may be implemented by a selective etching process. Thus, the median portion of the nanowires 11, 13, 15 and 17 made of SiGe is selectively removed with respect to the median portion of the nanowires 12, 14 and 16 made of silicon. The respective median portions 120, 140 and 160 of the nanowires 12, 14 and 16 are thus exposed. The median portions of the nanowires 11, 13, 15 and 17 are for example removed by selectively etching the SiGe, for example using an HCl-based selective etch. It is also possible to envisage selectively etching SiGe that has been made amorphous plumb with the groove 311. The median portions of the SiGe nanowires 11, 13, 15 and 17 leave behind a void 110.

Thus, an access to all the faces of the median portions 120, 140 and 160 of the nanowires 12, 14 and 16 is formed. The median portion of the nanowires 12, 14 and 16 corresponds to the channel zones of the gate-wrap-around transistor in the process of being formed. The internal spacers 18 and 19 and the lateral spacers 32 and 33 allow in particular the longitudinal ends of the nanowires 12, 14 and 16 to be protected during this selective etching operation.

Figure 13:
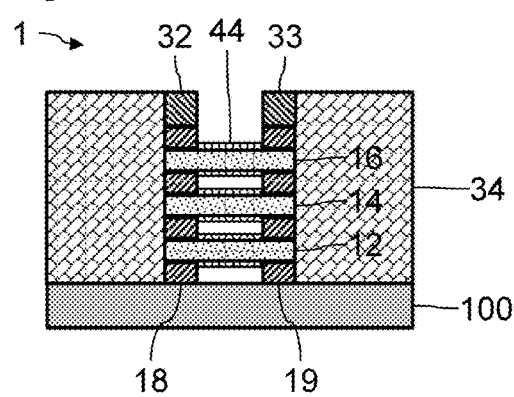

In FIG. 13, a gate insulator 44 has been formed around the median portions 120, 140 and 160 of the nanowires 12, 14 and 16. The gate insulator of each nanowire 12, 14 and 16 may for example comprise an interfacial oxide layer making contact with the nanowire, which layer is surmounted with an oxide layer wrapped around this interfacial layer. The wrap-around oxide layer may for example be made of $HfO_2$. Processes for forming the gate insulator 44 are known per se by those skilled in the art.

Figure 14:
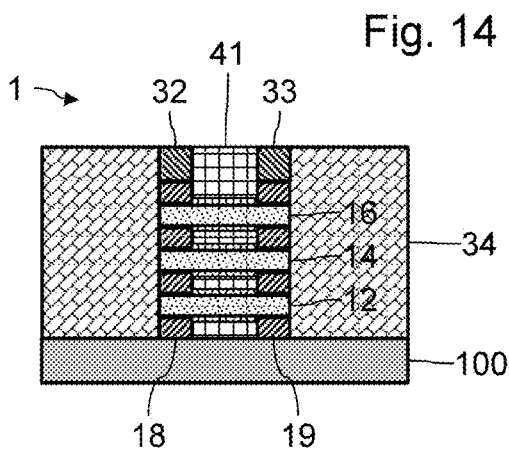

In FIG. 14, a wrap-around gate 41 has been formed by filling the voids encircling the median portions 120, 140 and 160 of the nanowires 12, 14 and 16 and the gate insulators 44. The wrap-around gate 41 may for example be produced in a way known per se by depositing a gate metal and/or by depositing highly doped polysilicon.

Figure 15:
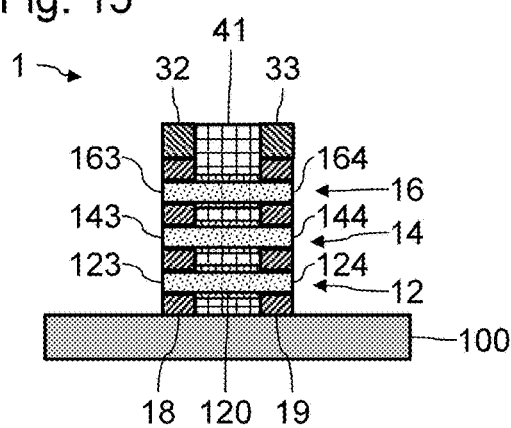

In FIG. 15, the encapsulation material 34 is removed. The lateral faces of the nanowires 12, 14 and 16 and of the internal spacers 18 and 19 are then exposed. The nanowire 12 thus includes longitudinal ends having exposed lateral faces 123 and 124. The nanowire 14 thus includes longitudinal ends having exposed lateral faces 143 and 144. The nanowire 16 thus includes longitudinal ends having exposed lateral faces 163 and 164. The median portion 120, 140 and 160 of the nanowires 12, 14 and 16 is covered by the gate stack at this stage (the gate stack here including the gate insulator 44 and the wrap-around gate 41 detailed above). A process for removing the encapsulation material 34 is known per se by those skilled in the art. The encapsulation material 34 made of $SiO_2$ may for example be selectively etched using HF or by means of fluorinated reactive ion etching (for example using $CHF$, $C_2F_6$, $C_4F_8$).

Figure 16:
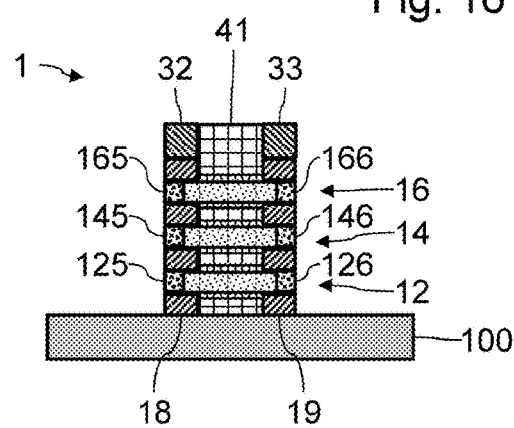

In FIG. 16, the longitudinal ends of the nanowires 12, 14 and 16 are doped. The ends of the nanowires 12, 14 and 16 are doped via the exposed lateral faces (123-124, 143-144 and 163-164, respectively). The nanowires 12, 14 and 16 thus have respective doped portions 125, 145 and 165 at one longitudinal end, and respective doped portions 126, 146 and 166 at a second longitudinal end. The ends of the nanowires 12, 14 and 16 are for example doped in a plasma doping step. Plasma doping may for example be implemented using As or B. The ionization energy of the plasma may for example be comprised between 1 in 10 keV. The doping dose may for example be comprised between 0.1 and $10*10^{14}$ cm$^{-2}$.

Such a doping operation is advantageously performed over a portion of the length (in the longitudinal direction) of the longitudinal ends of the nanowires, i.e. a portion of the width of the internal spacers 18 and 19. Thus, the doping operation may be performed such that the dopants do not reach the median portion of the nanowires 12, 14 and 16 that is arranged plumb with the wrap-around gate 41. The doped portions 125, 145, 165, 126, 146 and 166 are thus confined to the zone of the nanowires 12, 14 and 16 that is plumb with the spacers 18 and 19. In this way, the electrostatic integrity of the channel zones of the transistor 1 is not negatively affected.

Plasma doping makes it possible to obtain a uniform distribution of the dopants over each of the lateral faces, and a uniform distribution of the dopants for all of the lateral faces of the nanowires 12, 14 and 16.

The doping step may be followed by an anneal for activating the dopants. Such an anneal may be carried out with a reduced thermal budget, in order to avoid dopants in the median portion located under the gate stack. The anneal may for example be a spike anneal, with a spike at 1050° C. The anneal may also be performed using laser pulses having a duration of the order of a millisecond.

Figure 17:
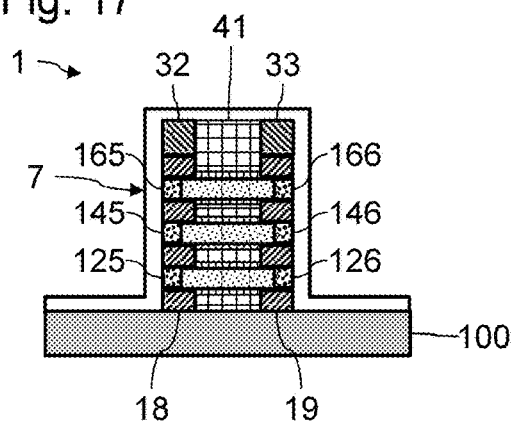

In FIG. 17, a silicon deposition step has been carried out. A silicon layer 7 is deposited and makes contact in particular with the doped portions 125, 145, 165, 126, 146 and 166. The silicon layer 7 may for example be formed by a chemical vapour deposition of amorphous silicon.

Figure 18:
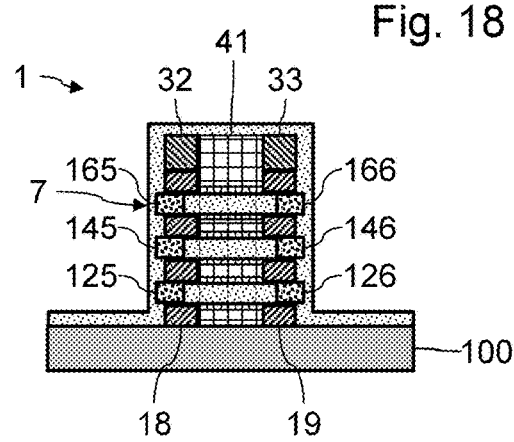

In step 18, a step of crystallizing the silicon layer 7 has been carried out. The crystallization step may be carried out by annealing, for example at a temperature of 600° C. for 60 seconds. Annealing in this way may lead to the dopants diffusing from the doped portions 125, 145, 165, 126, 146 and 166 into the layer 7. It is also possible to envisage using the steps from FIGS. 17 and 18 of the process starting from the configuration illustrated in FIG. 15, and carrying out a plasma doping operation subsequent to the step of crystallizing the silicon layer 7.

Figure 19:
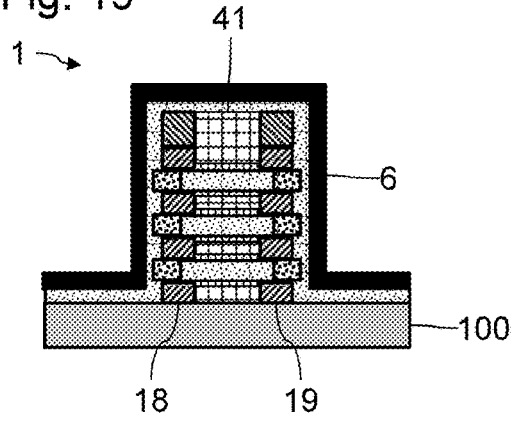

In FIG. 19, a wafer-scale deposition of a metal layer 6 is carried out, for example by chemical vapour deposition. The deposited metal is for example Ni. The metal layer 6 is in particular deposited on the crystalline silicon layer 7.

Figure 20:
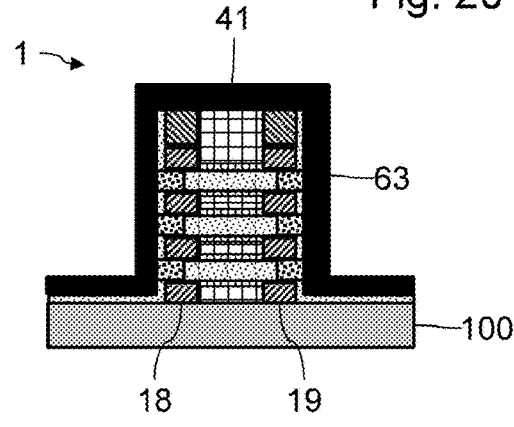

In FIG. 20, a silicide 63 is formed in the external portion of the layer 7, and in particular in line with the doped portions 125, 145, 165, 126, 146 and 166 of the nanowires 12, 14 and 16. The silicidation is carried out, for example, by annealing to react the Ni with the crystallized silicon. The silicide 63 extends up to contact with these doped portions 125, 145, 165, 126, 146 and 166. The silicide may in particular be formed by heat treatment (for example heating at 450° C. for one minute). The crystalline silicon then undergoes a silicidation by reacting with the metal of the layer 6. In particular, the silicidation of the Ni may result in the formation of crystalline $NiSi_2$ on the silicon, which forms a low Schottky barrier. Silicidation may be used to retain a doped and unsilicided internal portion between the median portions of the nanowires 12, 14 and 16 and their silicided terminal portions thus formed In FIG. 21, the unreacted portion of the metal layer 6 has also been removed. A removal of this type is for example achieved by means of an anisotropic etch using $H_2SO_4$. Two silicided walls 61 and 62 are thus retained, making contact with the doped portions of the nanowires 12, 14 and 16.

Figure 22:
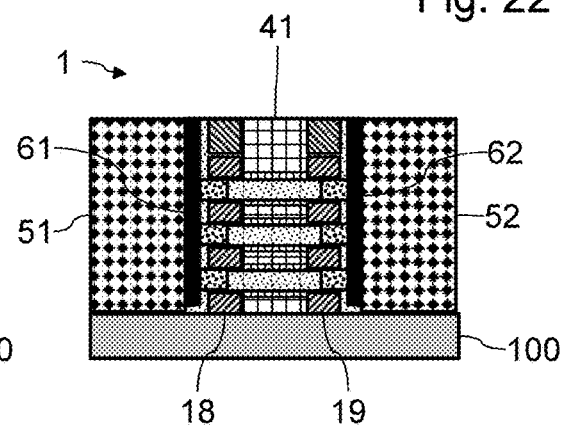

In FIG. 22, a metal is deposited to form source and drain contacts 51 and 52 for example by a wafer-scale deposition. The metal is in particular deposited on either side of the silicided walls 61 and 62, so as to make contact with these silicided walls. An electrical contact is thus formed between the contact 51 and the silicided walls 61. An electrical contact is also formed between the contact 52 and the silicided walls 62. The metal contacts 51 and 52 thus make electrical contact with the doped portions 125, 145, 165, 126, 146 and 166 of the nanowires 12, 14 and 16. Here, a step of chemical-mechanical polishing has been carried out subsequent to the deposition of the metal, to form an access to the wrap-around gate 41.

One and the same metal contact 51 or 52 for the ends of multiple nanowires allows substantially one and the same access resistance to be obtained, with an access resistance having an amplitude that is significantly lower than with a deposition of semiconductor by epitaxy. The electrical resistances between the various channel zones (corresponding to the median portions of the nanowires 12, 14 and 16) and the metal contacts 51 or 52 are thus identical. Since the electrical resistance through the metal contacts 51 and 52 is relatively low, the access resistances to the median portions of the nanowires 12, 14 and 16 are substantially identical.

The metal of the metal contacts 51 and 52 may for example be deposited by chemical vapour deposition (CVD). The deposited metal may for example be a stack of Ti of TiN and of W in succession.

In this embodiment, the longitudinal ends of the nanowires are doped and the metal contacts 51 and 52 are formed subsequent to the formation of the wrap-around gate 41. However, if the thermal budget used for forming the gate stack is relatively low, it is also possible to envisage doping the longitudinal ends of the nanowires and forming the metal contacts 51 and 52 in the presence of the internal spacers 18 and 19 but before the formation of the gate stack.

The silicide formed between the doped portions and the contacts 51 and 52 makes it possible to decrease the conduction resistance between these contacts and the channel zones.

Since plasma doping has a maximum implantation density at the surface, the contact resistance between the doped portions and the silicided terminal portions is decreased.

The thickness of the deposited silicon layer 7 is advantageously greater than the thickness of silicon consumed by the silicidation reaction. For example, for a metal layer 6 made of nickel, the thickness of the deposited silicon layer 7 must be at least 3.6 times greater than the thickness of the deposited nickel layer 6. The thickness of the non-silicided layer upon completion of this step is for example at least 3 nm. It is then possible to have a very large interface area between the doped portions and the silicided portions, thereby decreasing the electrical access resistance.

Such a process is particularly advantageous when the minimum thickness of silicide that may be formed by the silicidation process is greater than the length of the longitudinal ends of the nanowires 12, 14 and 16 that are present under the spacers 18 and 19. This is particularly advantageous when the width of the spacers 18 and 19 is reduced.

According to one variant, it is possible to envisage depositing an amorphous material consisting of a mixture of silicon and of metal on the crystalline silicon layer 7, instead of the metallization step and the silicidation step. Such a deposition operation may be performed with the desired stoichiometry for the silicide. Such a deposition operation may be followed by annealing to give it a crystalline configuration, for example at a temperature of 450° C. for 60 seconds for $NiSi_2$.

FIGS. 23 to 30 illustrate a transistor 1 in various steps of its fabricating process, according to one example of a second embodiment of the invention. The process according to the second embodiment may use the various steps of the process of the first embodiment, carried out until the configuration illustrated in FIG. is obtained. The process according to the second embodiment is applicable to nanowires 12, 14 and 16 made of pure silicon or of silicon alloys.

Figure 23:
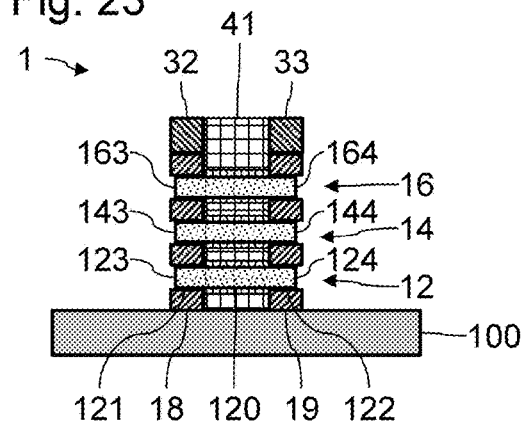
FIGS. 23 to 30 illustrate a transistor during various steps of its fabricating process, according to one example of a second embodiment of the invention.

In FIG. 23 removal operations are carried out level with the ends of the nanowires 12, 14 and 16. The lateral faces 123, 143 163 are thus set back with respect to the edge of the internal spacer 18, and are positioned plumb with this internal spacer 18. The lateral faces 124, 144 and 164 are set back with respect to the edge of the internal spacer 19, and are positioned plumb with this internal spacer 19. A removal of this type may for example be carried out to a depth comprised between 1 and 3 nm. A removal of this type may for example be a dry etching operation such as atomic layer etching (ALE) or reactive ion etching (RIE).

The subsequent steps correspond substantially to those of the first embodiment which are described with reference to FIGS. 16 to 22.

Figure 24:
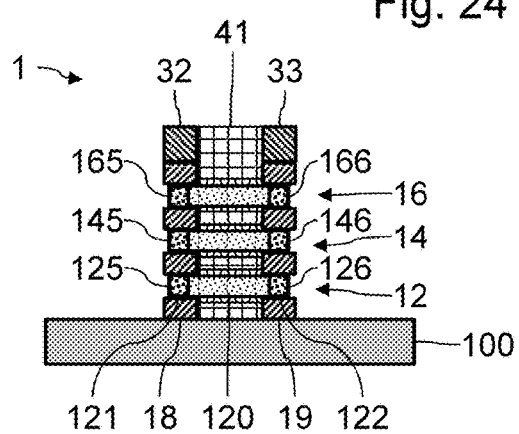

In FIG. 24, the ends of the nanowires 12, 14 and 16 are doped. The ends of the nanowires 12, 14 and 16 are doped via the exposed lateral faces (123-124, 143-144 and 163-164, respectively). The nanowires 12, 14 and 16 thus have respective doped portions 125, 145 and 165 at one end, and respective doped portions 126, 146 and 166 at a second end. Thus, the doping operation may be performed such that the dopants do not reach the median portion of the nanowires 12, 14 and 16 that is arranged plumb with the wrap-around gate 41. The doped portions 125, 145, 165, 126, 146 and 166 are thus confined to the zone of the nanowires 12, 14 and 16 that is plumb with the spacers 18 and 19.

The ends of the nanowires 12, 14 and 16 are for example doped by means of a plasma doping step, for example using the parameters described with reference to the first embodiment. Because of the removal of the lateral faces 123, 143, 163, 124, 144 and 164, the doped portions may be moved closer to the median portion of the nanowires 12, 14 and 16. The doping operation may be performed with a lower plasma energy, to obtain a junction having a sharper profile.

Figure 25:
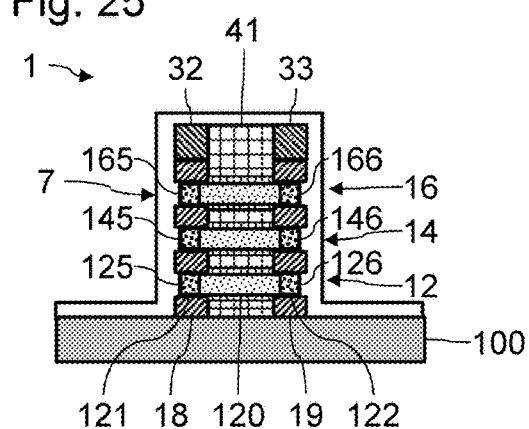

In FIG. 25, a silicon deposition step has been carried out. A silicon layer 7 is deposited and makes contact in particular with the doped portions 125, 145, 165, 126, 146 and 166. The silicon layer 7 may for example be formed by a chemical vapour deposition of amorphous silicon.

Figure 26:
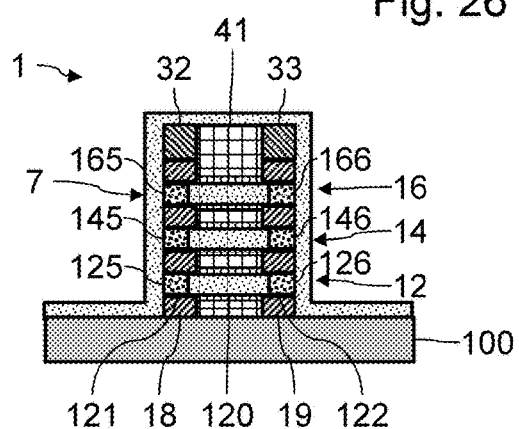

In FIG. 26, a step of crystallizing the silicon layer 7 has been carried out. The crystallization step may be carried out by annealing, for example at a temperature of 600° C. for 60 seconds. Annealing in this way may lead to the dopants diffusing from the doped portions 125, 145, 165, 126, 146 and 166 into the layer 7.

Figure 27:
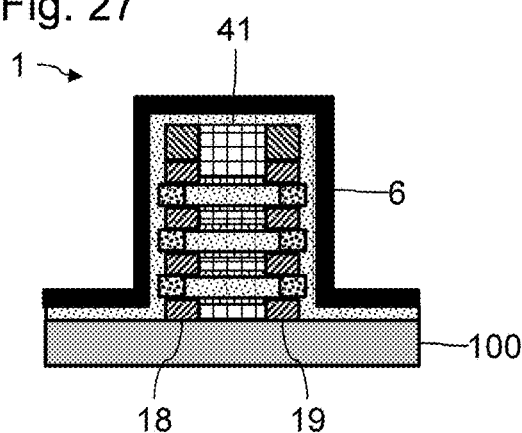

In FIG. 27, a wafer-scale deposition of a metal layer 6 is carried out, for example by chemical vapour deposition. The deposited metal is for example Ni. The metal layer 6 is in particular deposited on the crystalline silicon layer 7.

Figure 28:
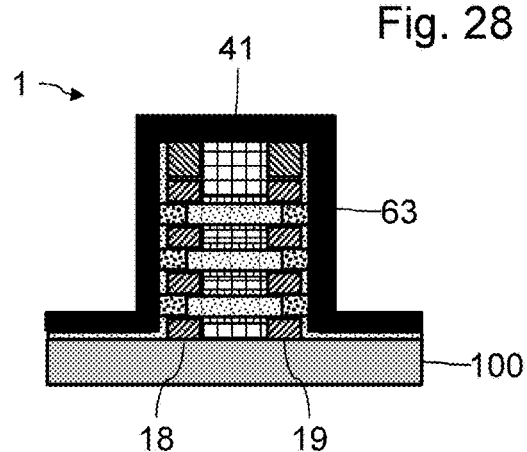

In FIG. 28, a silicide 63 is formed in the external portion of the layer 7, and in particular in line with the doped portions 125, 145, 165, 126, 146 and 166 of the nanowires 12, 14 and 16. Silicidation is carried out, for example, by annealing to react the Ni with the crystalline silicon. The silicide 63 extends up to contact with these doped portions 125, 145, 165, 126, 146 and 166. The silicide may in particular be formed by heat treatment (for example heating at 450° C. for one minute). The crystallized silicon then undergoes a silicidation by reacting with the metal of the layer 6.

Figure 29:
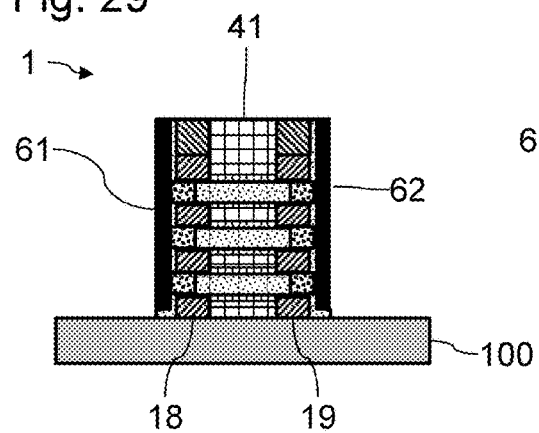

In FIG. 29, the unreacted portion of the metal layer 6 has also been removed. A removal of this type is for example achieved by means of an anisotropic etch using $H_2SO_4$. Two silicided walls 61 and 62 are thus retained, making contact with the doped portions of the nanowires 12, 14 and 16.

Figure 30:
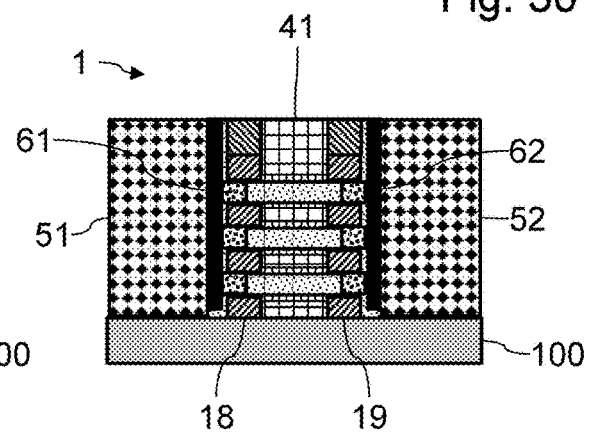

In FIG. 30, a metal is deposited to form source and drain contacts 51 and 52, for example via a wafer-scale deposition. The metal is in particular deposited on either side of the silicided walls 61 and 62, so as to make contact with these silicided walls. An electrical contact is thus formed between the contact 51 and the silicided walls 61. An electrical contact is also formed between the contact 52 and the silicided walls 62. The metal contacts 51 and 52 thus make electrical contact with the doped portions 125, 145, 165, 126, 146 and 166 of the nanowires 12, 14 and 16. Here, a step of chemical-mechanical polishing has been carried out subsequent to the deposition of the metal, to form an access to the wrap-around gate 41.

Such a variant makes it possible to position a sharp junction of the doped region of the nanowires 12, 14 and 16 in proximity to their median portions, forming the channel zones. A plasma doping operation with a lower energy may thus be used, and a junction having a sharper profile obtained. Such a configuration promotes a good trade-off between short-channel effects and low access resistance.

Figure 21:
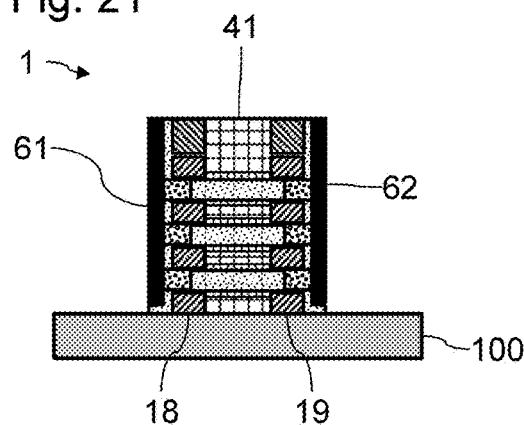

According to one variant, after the steps illustrated respectively in FIGS. 21 and 29, according to variant embodiments, a dielectric layer may be deposited. The dielectric layer makes contact in particular with the silicided walls 61 and 62.

For a transistor 1 with an n-type channel, it may be advantageous to deposit a layer of dielectric having its conduction band aligned with the conduction band of the channel material. It would for example be possible to use a dielectric layer made of $TiO_2$ for Si- or SiGe-based channels. The thickness of the dielectric layer could, for example, be between 1 nm and 3 nm, for example 1.5 nm. The process of depositing the dielectric layer is known per se by those skilled in the art.

A wafer-scale deposition of a bottom metal layer may advantageously be carried out. The metal layer is in particular deposited on the dielectric layer, in line with the nanowires 12, 14 and 16. The deposited metal is intended to exhibit a low Schottky barrier with respect to the material of the channel zones. The deposited metal could for example be Zr. An MIS (metal-insulator-semiconductor) contact is thus formed level with each longitudinal end of the nanowires 12, 14 and 16.

Another metal layer may then be deposited. The other metal layer is in particular deposited on either side of the nanowires 12, 14 and 16, so as to make contact with the bottom metal layer. The metal of this other metal layer may for example be Ti, TiN or W. An electrical contact is thus formed between the other metal layer and the doped portions 125, 145, 165, 126, 146 and 166.

Forming MIS contacts provides the advantage of lower electrical resistance between the contacts 51 and 52 and the nanowires 12, 14 and 16.

Using the bottom metal layer made of a material exhibiting a low Schottky barrier makes it possible to avoid Fermi level pinning effects (which result in higher-than-expected effective Schottky barriers).

Figure 31:
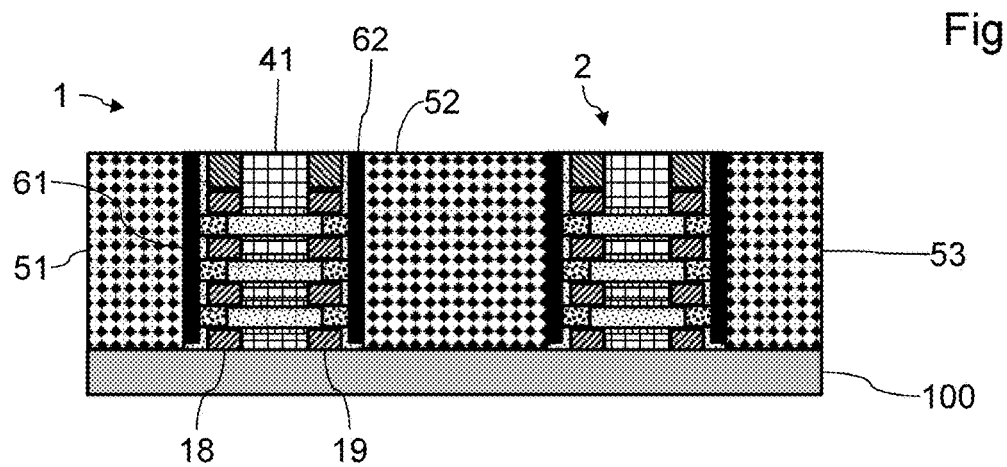
FIG. 31 illustrates two transistors obtained according to one variant of the first embodiment.

FIG. 31 illustrates a cross-sectional view of a structure obtained according to one variant of the process of the first embodiment. In this configuration, common contacts between transistors are used to induce longitudinal tensile or compressive strains in the median portion of their nanowires. In this example, a transistor 1 having contacts 51 and 52 and a transistor 2 having a contact 53 and sharing the contact 52 have been formed. The contacts 51 to 53 are for example made of W. The presence of the contact 52 between the transistors 1 and 2 allows for example an intrinsic compressive strain to develop.

The embodiments described above are based on an initial superposition of silicon and silicon-germanium layers. It is however also possible to envisage other types of semiconductors in this superposition; for example, it is possible to envisage producing a superposition of nanowires of III-V semiconductors, for example of InAs and InGaAs. The superposition of the nanowires may include nanowires made of at least three different semiconductors. It is then possible to use specific metallizations using a metal alloy of the semiconductor, for example based on Ni, Pd, Ti, Au or Mo.

In the embodiments described above, the nanowires have a substantially square cross section. Other cross sections may of course be envisaged, for example ovoid, trapezoidal, or rectangular. Nanowires taking the form of nanosheets may for example be used, and thus have a cross section in which the width is at least equal to 2 times the height.

In the embodiments described above, the transistor 1 includes three nanowires to form the same number of superposed channel zones. Provision may also be made for a superposition of any suitable number of nanowires at least equal to 2.

The invention claimed is:

1. A process for fabricating a gate-wrap-around field-effect transistor, comprising:
   providing a substrate surmounted with first and second nanowires made of semiconductor material extending in a same longitudinal direction and being arranged plumb with one another, each of the first and second nanowires having:
      a median portion, covered by a first material, and
      first and second ends that are arranged on either side of the median portion in said same longitudinal direction, a periphery of which being covered by respective first and second dielectric spacers made of a second material that is different from the first material, said first and second ends respectively having first and second exposed lateral faces;
   doping a portion of the first and second ends via said first and second lateral faces;
   depositing an amorphous silicon alloy on said first and second lateral faces of said first and second nanowires, followed by a step of crystallizing said amorphous silicon alloy; and
   depositing a metal on either side of the first and second nanowires to form first and second metal contacts that respectively make electrical contact with the doped portions of the first and second ends of the first and second nanowires.

2. The process for fabricating a gate-wrap-around field-effect transistor according to claim 1, wherein the first and second ends of said first and second nanowires are doped by means of plasma, implantation, diffusion, or dilation.

3. The process for fabricating a gate-wrap-around field-effect transistor according to claim 1, wherein said first material is a gate insulator, said gate insulator being covered by a conductive gate.

4. The process for fabricating a gate-wrap-around field-effect transistor according to claim 1, wherein the first and second nanowires are made of a silicon alloy.

5. The process for fabricating a gate-wrap-around field-effect transistor according to claim 4, further comprising a step of siliciding the first and second lateral faces of said doped portions of the first and second ends of the first and second nanowires.

6. The process for fabricating a gate-wrap-around field-effect transistor according to claim 5, wherein said step of siliciding comprises depositing a metal layer on said first and second lateral faces and annealing the deposited metal layer.

7. The process for fabricating a gate-wrap-around field-effect transistor according to claim 1, wherein said first and second lateral faces of said first and second provided nanowires are set back with respect to said first and second spacers, respectively.

8. The process for fabricating a gate-wrap-around field-effect transistor according to claim 7, wherein the step of depositing the amorphous silicon alloy followed by the step of crystallizing said amorphous silicon alloy are performed so as to extend said doped portions of the first and second nanowires.

9. The process for fabricating a gate-wrap-around field-effect transistor according to claim 1, further comprising a step of depositing a layer of dielectric material on the crystallized silicon alloy, and depositing said metal forming the first and second metal contacts on said layer of dielectric material.

10. The process for fabricating a gate-wrap-around field-effect transistor according to claim 9, wherein said layer of dielectric material and said metal are deposited so as to form said first and second metal contacts in the form of metal-insulator-semiconductor (MIS) contacts.

11. The process for fabricating a gate-wrap-around field-effect transistor according to claim 9, wherein the step of depositing the amorphous silicon alloy followed by the step of crystallizing said amorphous silicon alloy are performed so as to extend said doped portions of the first and second nanowires.

12. The process for fabricating a gate-wrap-around field-effect transistor according to claim 1, wherein said first and second ends of the first and second nanowires each have a length comprised between 5 nm and 10 nm.

13. The process for fabricating a gate-wrap-around field-effect transistor according to claim 1, wherein said first and second nanowires have a thickness at most equal to 15 nm.

* * * * *